United States Patent [19]

Koyama

[11] Patent Number: 4,630,085
[45] Date of Patent: Dec. 16, 1986

[54] ERASABLE, PROGRAMMABLE READ-ONLY MEMORY DEVICE

[75] Inventor: Shoji Koyama, Tokyo, Japan

[73] Assignee: NEC Corporation, Tokyo, Japan

[21] Appl. No.: 706,332

[22] Filed: Feb. 27, 1985

[30] Foreign Application Priority Data

Feb. 28, 1984 [JP] Japan ................................ 59-36504

[51] Int. Cl.⁴ ...................... H01L 29/78; G11C 11/40
[52] U.S. Cl. .................................... 357/23.5; 357/41; 365/185
[58] Field of Search .................. 357/23.5, 41; 365/184, 365/185

[56] References Cited

U.S. PATENT DOCUMENTS

| | | | |
|---|---|---|---|
| 4,258,378 | 3/1981 | Wall | 357/23.5 |
| 4,376,947 | 3/1983 | Chiu et al. | 357/23.5 |
| 4,412,311 | 10/1983 | Miccoli et al. | 357/23.5 |

OTHER PUBLICATIONS

"Unintentional Writing of a FAMOS Memory Device During Reading", Kjell O. Jeppson and Christer M. Svensson, *Solid-State Electronics*, 1976, vol. 19, pp. 455–457.

*Primary Examiner*—Gene M. Munson
*Attorney, Agent, or Firm*—Burns, Doane, Swecker and Mathis

[57] ABSTRACT

An erasable, programmable read-only memory device comprises a plurality of memory cells of channel injection type. First and second impurity regions used as source and drain have different configurations such that when the same level of voltages are applied to first and second impurity regions, respectively, the intensity of electric field near the channel region in the depletion layer between the second impurity region and the substrate is weaker than that in the depletion layer between the first impurity region and the substrate. In the writing operation, a higher voltage in absolute value is applied to the first impurity region and channel current flows in one direction. Therefore, hot electrons can be effectively injected into the floating gate near the first impurity region. On the other hand in the reading operation, a higher voltage in absolute value is applied to the second impurity region and channel current flows in the opposite direction. The voltage in the reading operation is lower in absolute value than the voltage in the writing operation. According to such a device, the unintentional injection writing phenomenon in the reading operation can be suppressed.

3 Claims, 6 Drawing Figures

ERASABLE, PROGRAMMABLE READ-ONLY MEMORY DEVICE

BACKGROUND OF THE INVENTION

The present invention relates to an erasable, programmable read-only semiconductor memory device (hereinafter referred to as EPROM device) having a plurality of erasable, programmable read-only semiconductor memory cells (hereinafter referred to as EPROM cells) of the insulated gate field-effect transistor construction provided with floating gate electrodes and control gate electrodes. More specifically, the invention relates to an EPROM device having EPROM cells of the channel injection type.

In the EPROM device, electric charges such as the electrons can be injected into the floating gate of the EPROM cell by the method of tunnel injection, avalanche breakdown injection, channel injection or F-N injection. The present invention is concerned with an EPROM device of the channel injection type in which the electric current is allowed to flow in a channel region, and hot electrons generated in this region are injected into the floating gate electrode.

In recent years, the EPROM device is widely used since it can be easily manufactured and it can hold the data with high reliability. Moreover, its memory capacity has been greatly increased owing to the reduction in the size of the transistors, i.e., owing to the reduction in the size of the EPROM cells. However, a problem is arising with regard to reduced withstand voltage between the source region and the drain region and reduced breakdown voltage between the drain or source region and the substrate accompanying the reduction in the size of the transistors. Therefore, limitation has been imposed on setting a programming voltage, i.e., on setting a writing voltage, and increasing demand has been placed for programming the memory cells with a low voltage.

In the conventional EPROM of the channel injection type, however, the electric current flows in the same direction both in the writing operation and the reading operation. Voltages of the same polarity are applied to the same impurity regions of drain and source both in the writing operation and the reading operation. Therefore, the voltage in the reading operation must be for lower than that of the writing operation. However, as mentioned above, the recent EPROM device is designed such that with a low voltage the writing operation can be achieved, that is, the writing operation voltage per se is low. Therefore, the difference between the voltage levels in the writing operation and the reading operation becomes small. In this case, hot electrons are gradually injected in the floating gate electrode during the reading operation. The same phenomenon has already discovered in the EPROM of avalanche breakdown injection type and called as unintentional injection writing by Kjell O. Jeppson et al. in "Solid-State Electronics", 1976, Vol. 19, pp. 455–457. The unintentional writing phenomenon must be taken into consideration with respect to not only an ordinary reading voltage but also a surge voltage that generates instantaneously. Therefore, this phenomenon triggers a serious problem from the standpoint of reliability such as change in the data that are held for extended periods of time. Moreover, this problem restricts the freedom of designing and producing the memory cell devices that operate with a low programming voltage.

SUMMARY OF THE INVENTION

The object of the present invention is to provide a highly reliable EPROM device of the channel injection type which is free from the unintentional writing phenomenon in the reading operation and which enhances the programming efficiency with a low writing voltage.

According to one feature of the present invention, there is provided an EPROM device comprising a plurality of EPROM cells of channel injection type formed in a semiconductor substrate of one conductivity type in a matrix shape, a plurality of bit lines extending on one major surface of the substrate, and a plurality of address lines extending on the one major surface of the substrate, each of the EPROM cells including a first impurity region of the opposite conductivity type formed in the one major surface of the substrate, a second impurity region of the opposite conductivity type formed in the one major surface of the substrate and electrically connected to the corresponding bit line, a channel region positioned between the first and second impurity regions, a floating gate electrode formed on the channel region via a first gate insulating film, and a control gate electrode formed on the floating gate electrode via a second gate insulating film and electrically connected to the corresponding address line, the second impurity region being so constituted that the intensity of electric field near the channel region in a depletion layer formed between the second impurity region and the substrate is weaker than that in a deplection layer formed between the first impurity region and the substrate when an inversed voltage of a predetermined level against the substrate is applied to the first and second impurity region, respectively, the EPROM device further comprising a first means for applying voltages to the first and second impurity regions and the control gate electrode of a selected EPROM cell such that electric channel current flows in one direction between the first and second regions of the selected EPROM cell in the writing operation, and a second means for applying voltages to the first and second impurity regions and the control gate electrode of a selected EPROM cell such that electric channel current may flow in the opposite direction between the first and second impurity regions in the reading operation. In the writing operation, a higher voltage in absolute value is applied to the first impurity region and channel current flows in one direction. Therefore, hot electrons can be effectively injected into the floating gate near the first impurity region. On the other hand, in the reading operation, a higher voltage in absolute value is applied to the second impurity region and channel current flows in the opposite direction. The voltage in the reading operation is lower in absolute value than the voltage in the writing operation. According to such a device, the unintentional injection writing phenomenon in the reading operation can be suppressed. For example, in a N-channel type EPROM device, when the writing operation is conducted, the substrate and the second impurity region are maintained at zero volt, that is, ground potential, and the control gate electrode and the first impurity region are supplied with positive potentials of, e.g., 13 volts and 6 volts, respectively. In this case, electrons flow from the second impurity region toward the first impurity region. In other words, an electric current flows through the channel from the first impurity region toward the second impurity region, and hot electrons are injected in the floating gate electrode near the first impurity region in the selected EPROM cell. Whereas, in the reading operation, the substrate and the first impurity region are maintained at zero volt, that is, ground potential, and the control gate electrode and the second impurity region are supplied with positive potentials of, for example, 5 volts and 2.5 volts, respectively. If the EPROM cell selected in reading operation is one with electrons having not been injected in its floating gate electrode, which cell has a low threshold voltage state, electrons flow from the first impurity region toward the second impurity region, that is, the channel current flows from the second impurity region toward the first impurity region. In the reading operation, the positive voltage of 2.5 volts is applied to the second impurity region which induces weaker electric field in the vicinity of the channel region. Therefore, electrons are not introduced into the floating gate electrode in the reading operation. Namely, the unintentional writing phenomenon can be prevented.

In the case of P-channel type EPROM device, in the writing operation, the substrate and the second impurity region are maintained at zero, for example, and the first impurity region is supplied with a negative voltage, with the result that holes flow from the second impurity region toward the first impurity region. In the reading operation, the substrate and the first impurity region are maintained at zero, for example, and the second impurity region has a negative voltage, with a result of holes flowing from the first impurity region to the second impurity region. Therefore, the effect mentioned above in the N-channel type EPROM device is also expected in the P-channel type EPROM device.

Namely, in both of N-channel type and P-channel type EPROM devices, the first impurity region is used as drain and the second impurity region is used as source in the writing operation. On the other hand, in the reading operation, the first impurity region is used as source and the second impurity region is used as drain. The first impurity region may be wholly of substantially uniform, high impurity concentration. The second impurity region may include a first portion having the same impurity concentration as that of the first impurity region and a second portion having a lower impurity concentration than that of the first portion and positioned between the first portion and the channel region.

DESCRIPTION OF THE PRIOR ART

Figure 1:
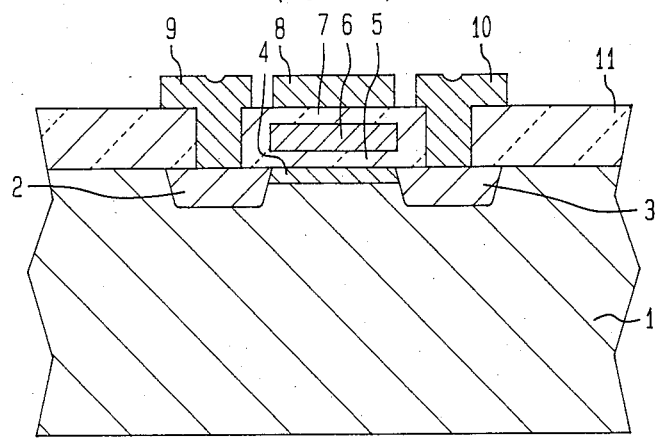
FIG. 1 is a cross-sectional view showing a memory cell in a conventional EPROM device.

With reference to FIG. 1, n-type source and drain regions 3, 2 having the same shape and the same impurity concentration ($1 \times 10^{20}$ to $4 \times 10^{20}$ atoms/cm$^3$) are formed in a p-type semiconductor substrate 1 having an impurity concentration of from $5 \times 10^{14}$ to $2 \times 10^{15}$ atoms/cm$^3$. The distance between the source region and the drain region is 2 $\mu$m, i.e., the channel region has 2 $\mu$m length and where is formed a p$^+$-type region 4 having an impurity concentration of from $2 \times 10^{16}$ to $6 \times 10^{16}$ atoms/cm$^3$. Over the channel region 4, there is formed a floating gate 6 composed of polycrystalline silicon via a first gate insulating film 5 which is composed of silicon dioxide and which is 500 angstroms thick. A control gate 8 composed of polycrystalline silicon is further formed thereon via a second gate insulating film 7 which is 500 angstroms thick and which is composed of silicon dioxide. Aluminum electrodes 10, 9 are connected to the source and drain regions 3, 2 as source and drain lead electrodes, respectively.

With the thus constructed conventional EPROM cell, the direction of channel current for writing the data by the channel injection method is always the same as the direction of channel current for reading the data. For instance, when the n-type region 2 works as the drain region and the n-type region 3 as the source region, a positive potential is applied to the drain region 2 through the drain electrode 9 and ground potential is applied to the source region 3 through the source electrode 10 during either the writing operation or the reading operation.

Figure 2:
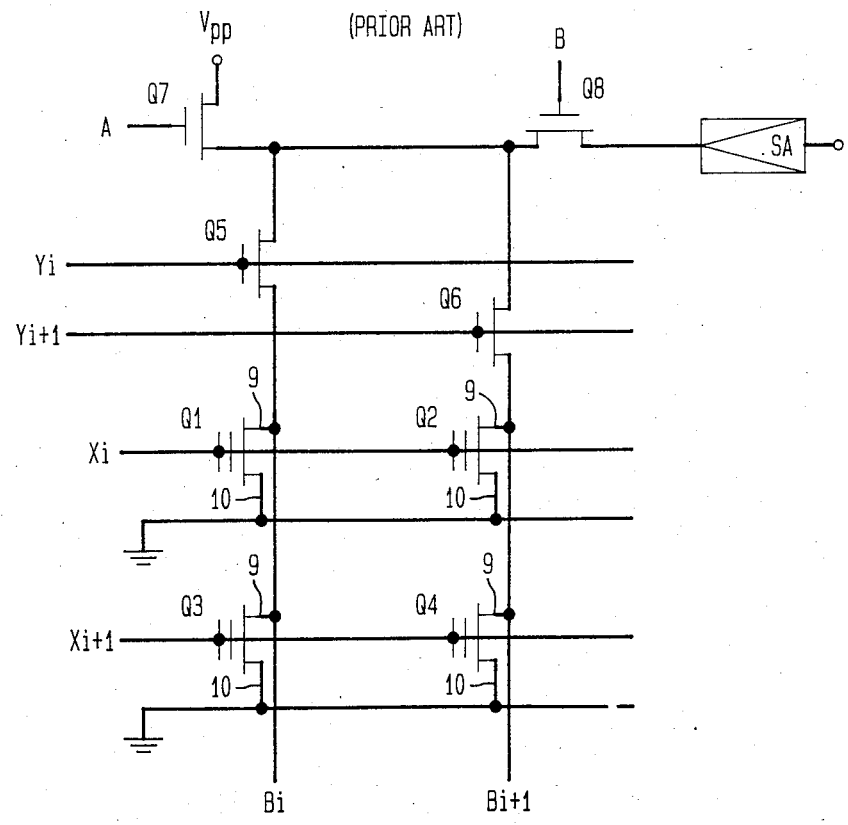
FIG. 2 is a circuit diagram showing a conventional EPROM device employing the memory cells of FIG. 1.

The operation will be described below in conjunction with FIG. 2 which is a circuit diagram showing a main portion of a conventional EPROM device having memory cells $Q_1$ to $Q_4$ of FIG. 1. The control gate electrodes of memory cells $Q_1$, $Q_2$ are connected to an address line $X_i$, and the control gate electrodes of memory cells $Q_3$, $Q_4$ are connected to an address line $X_{i+1}$. The drains 2 of memory cells $Q_1$, $Q_3$ are connected to a bit line $B_i$ via electrodes 9, and the drains 2 of memory cells $Q_2$, $Q_4$ are connected to a bit line $B_{i+1}$ via electrodes 9. Each bit line is connected to a power source $V_{pp}$ via a transfer gate $Q_7$ of an insulated gate field effect transistor (hereinafter referred to as IGFET) and to a sense amplifier SA via a transfer gate $Q_8$ of an IGFET. Bit line select signal lines $Y_i$, $Y_{i+1}$ are connected to the gates of transfer gates $Q_5$, $Q_6$ of IGFET's, respectively, and the sources of memory cells $Q_1$ to $Q_4$ are served with ground potential or a low fixed potential. Control signals A, B are connected to the gates of transfer gates $Q_7$, $Q_8$ of IGFET's, respectively.

As mentioned above, in the prior art, the source region and the drain region of the EPROM cell shown in FIG. 1 have the same impurity concentration and the same shape, and in the writing operation and in the reading operation, the electric channel currents flow the same direction. However, when an EPROM device which permits a low-voltage writing to be effected is constituted based upon the above-mentioned memory cell array, there arises the problem of unintentional writing as described earlier.

Figure 3:
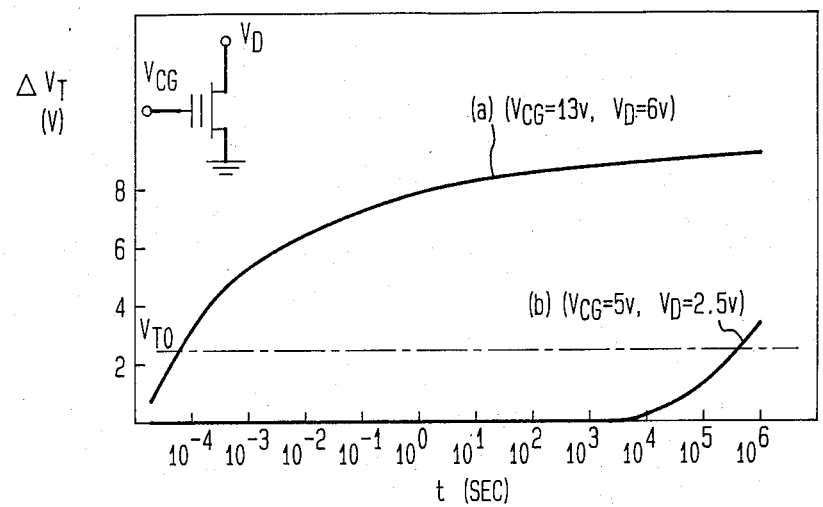
FIG. 3 is a characteristic diagram showing the change of threshold voltage of a memory cell of the prior art with the lapse of time during the writing operation (a) and the reading operation (b)

For example, to write a data onto the EPROM cell $Q_1$, i.e., to inject the electrons into the floating gate electrode of the cell $Q_1$ to selectively increase its threshold voltage, voltages must be applied as described below. Namely, predetermined voltages are applied via the control signal line A and bit line select signal line $Y_i$ to render the transistors $Q_7$ and $Q_5$ conductive state, while voltages are applied via the control signal line B and bit line select signal line $Y_{i+1}$ to maintain the transistors $Q_8$ and $Q_6$ nonconductive state. Further, a positive voltage of 13 volts is applied to the control electrode via address line $X_i$, while the address line $X_{i+1}$ is maintained at 0 volt, i.e., at ground potential. Therefore, only the EPROM cell $Q_1$ is served with a positive voltage of 6 volts from the power supply $V_{pp}$ through the bit line $B_i$ and the electrode 9 to the drain 2 and with a positive voltage of 13 volts through the address line $X_i$ to the control gate electrode 8. Here, the source region 3 is grounded through the electrode 10. Thus, the electrons are selectively injected into the floating gate electrode 6 of the cell $Q_1$ by the channel injection only among the EPROM cells $Q_1$ to $Q_4$. Namely, in the EPROM cell $Q_1$, the electrons flow from the source to the drain (i.e., an electric channel current flows from the drain to the source), hot electrons (electrons having large energy) generate in the vicinity of the drain and are injected into the floating gate due to an electric field established by the positive voltage applied to the control electrode. That is, an ordinary channel injection takes place in the transistor $Q_1$. This condition is represented by a curve (a) in FIG. 3. Changing quantity $\Delta V_T$ from the erasing state in the threshold voltage $V_T$ of the transistor $Q_1$ easily exceeds a threshold voltage $V_{T0}$ for determining "1" and "0", and a predetermined data is written. According to the conventional technique as described above, no problem develops in the writing operation.

With the conventional technique, however, a problem develops in the reading operation.

Described below is the case where the EPROM cell $Q_2$ is selectively read out. The cell $Q_2$ is assuming a low threshold voltage since no electron has been injected into the floating gate in the previous writing operation. Namely, the changing quantity $V_T$ is zero volt in FIG. 3. In order to selectively read the cell $Q_2$, the transistors $Q_8$ and $Q_6$ are rendered conductive state by applying a predetermined voltage thereto through the control signal line B and bit line select signal line $Y_{i+1}$. On the other hand, no voltage is applied through the control signal line A and the bit line select signal line $Y_i$, and the transistors $Q_7$ and $Q_5$ are maintained nonconductive state. Further, a positive voltage of 5 volts is applied to the control electrode 8 of the cell $Q_2$ via the address line $X_i$, but the address line $X_{i+1}$ is maintained at zero volt, i.e., maintained at ground potential. Therefore, only the EPROM cell $Q_2$ receives a positive voltage of 2.5 volts from the sense amplifier SA at its drain region 2, and receives a positive voltage of 5 volts through the control electrode 8. Here, the source region 3 is grounded through the electrode 10. Therefore, only the cell $Q_2$ is selectively read out among the EPROM cells $Q_1$ to $Q_4$. Here, the cell $Q_2$ has the threshold voltage which is zero voltage deviation ($\Delta V_T = 0$) from the erasing state and is rendered conductive by the control voltage of 5 volts to permit the electric current to flow. Namely, the cell $Q_2$ operates as an ordinary IGFET so that electrons flow from the source to the drain (i.e., a current flows from the drain to the source), proving that no electron had been injected to the floating gate of the cell $Q_2$ via the sense amplifier SA.

However, the above ordinary condition is maintained only for an initial period of time. After a time of $10^5$ to $10^6$ seconds, the threshold voltage exceeds the value $V_{T0}$ and the cell $Q_2$ is rendered nonconductive state as represented by a curve (b) in FIG. 3. That is, even if a voltage of 5 volts is applied to the control electrode of an EPROM cell, the channel portion is applied with a voltage which may be equivalent to a voltage of about 2.5 volts applied to the gate of an ordinary IGFET due to the presence of the floating gate. However, if the threshold voltage exceeds 2.5 volts, the cell $Q_2$ is rendered nonconductive state as described above, as a matter of course. Namely, the EPROM cell develops a phenomenon as if there is written the data by injecting electrons into the floating gate electrode.

The phenomenon of unintentional writing develops in modern EPROM devices since they have been so constructed that the data can be written on a low voltage at a high speed. Therefore, using the device which is designed to write the data by the channel injection by applying a voltage of 13 volts to the control electrode and applying a voltage of 6 volts to the drain, it can be attempted to read the data by applying a voltage of 5 volts and a voltage of 2.5 volts thereto. Even in this case, however, there takes place undesired phenomenon of channel injection with the passage of time in the reading operation, whereby the threshold voltage exceeds the value $V_{T0}$ for determining "1" and "0" of the sense amplifier, and the stored data is inverted.

To avoid the occurrence of such a phenomenon, the read voltage must be set at a low value corresponding to the reduction in the program voltage. This, however, causes the current to be reduced that flows during the reading operation, and increased burden must be carried by the sense amplifier and by the design thereof.

With the conventional EPROM device of the channel injection type as described above, various problems stem from the phenomenon of unintentional writing.

DESCRIPTION OF THE EMBODIMENT

Figure 4:
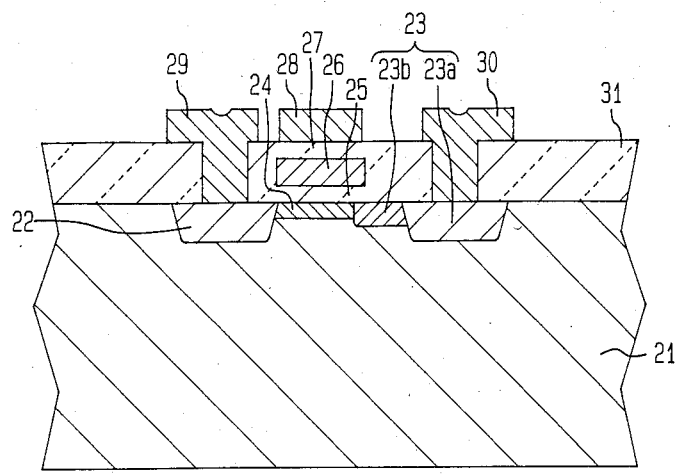
FIG. 4 is a cross-sectional view showing a memory cell is an embodiment of the present invention.

Referring to FIG. 4, a first n-type region 22 and a second n-type region 23 are formed in a p-type semiconductor substrate 21 having an impurity concentration of $5 \times 10^{14}$ to $2 \times 10^{15}$ atoms/cm$^3$. The first region consists of an n-type impurity region 22 having an impurity concentration of $1 \times 10^{20}$ to $4 \times 10^{20}$ atoms/cm$^3$, and the second region 23 consists of an n-type higher impurity portion 23a having an impurity concentration of $1 \times 10^{20}$ to $4 \times 10^{20}$ atoms/cm$^3$ and an n-type lower impurity portion 23b having an impurity concentration of $1 \times 10^{17}$ to $1 \times 10^{19}$ atoms/cm$^3$ which is formed between the impurity portion 23a and the channel region. Thus, the first region and the second region are constructed differently such that electric fields of different intensities are established in the depletion layers thereof. That is, when a positive voltage of the same level against the substrate 21 is applied to an aluminum electrode 29 that connects to the first region 22 and to an aluminum electrode 30 that connects to the second region 23, the field intensity of the depletion layer faced to the channel region of the first region 22 should be stronger than the field intensity of the depletion layer faced to the channel region of the second region 23.

A p-type region having an impurity concentration of $2 \times 10^{16}$ to $6 \times 10^{16}$ atoms/cm$^3$ is formed in the channel region, and a floating gate electrode 26 composed of polycrystalline silicon is formed over the channel region via a first gate insulating film 25 which consists of a silicon oxide film and which is 500 angstroms thick. Further, a control gate electrode 28 composed of polycrystalline silicon is formed over the floating gate electrode 26 via a second gate insulating film 27 which consists of a silicon oxide film and which is 500 angstroms thick. Here, reference numeral 31 denotes a field insulating film.

According to the present invention constructed as described above, the data is written by applying a high positive voltage to the first region 22 to flow electrons from the second region 23 to the first region 22 (i.e., to flow a electric channel current from the first region 22 to the second region 23) in a customary manner. Namely, the first region 22 is used as the drain and the second region 23 is used as the source. To read out the data, however, the positive voltage is applied to the second region 23 to flow electrons from the first region 22 to the second region 23 (i.e., to flow the electric channel current from the second region 23 to the first region 22). That is, in this case, the second region 23 is used as the drain and the first region 22 is used as the source.

To write the data according to the present invention, the positive voltage is applied to the first region 22 where an intense electric field is established in the depletion layer. Therefore, hot electrons are efficiently injected into the floating gate electrode 26 in a customary manner. To read out the data, on the other hand, the positive voltage is applied to the second region 23 where less intense electric field is established in the depletion layer. Therefore, the phenomenon of unintentional writing does not take place.

Figure 5:
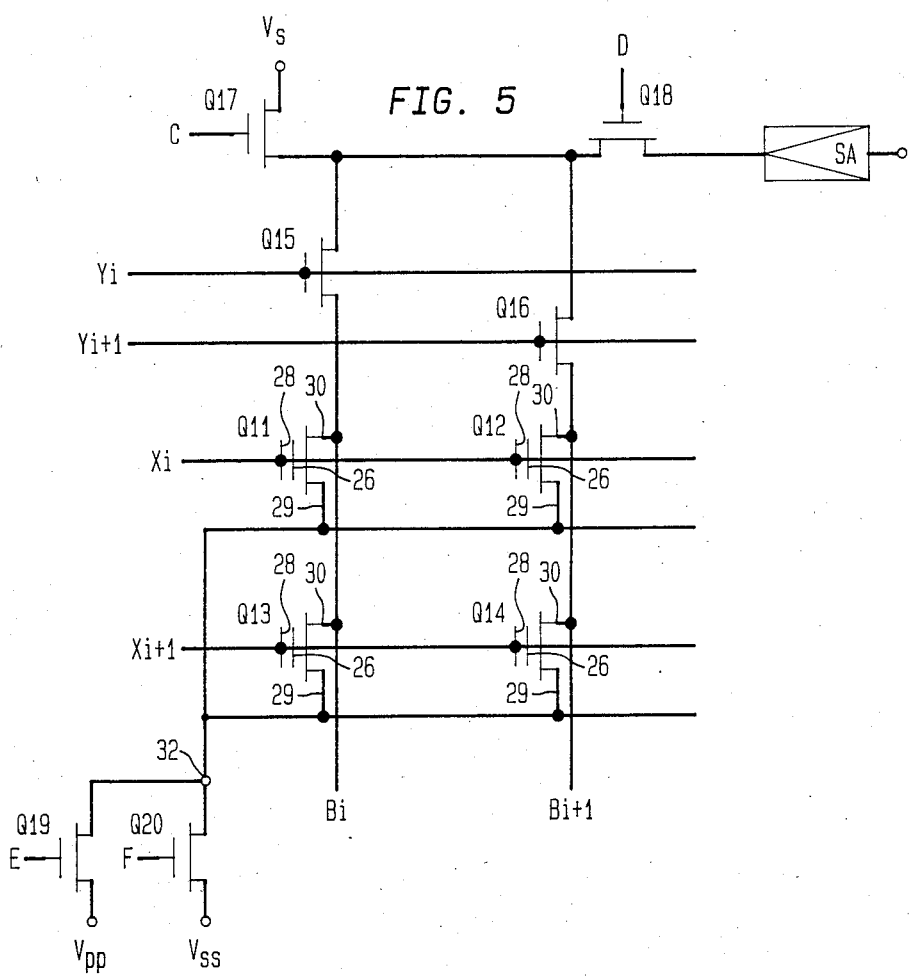
FIG. 5 is a circuit diagram showing an embodiment of the present invention employing the memory cells of FIG. 4.

FIG. 5 is a circuit diagram of an EPROM device in which a plurality of EPROM cells of FIG. 4 are arranged in the form of a matrix. That is, the EPROM device comprises a memory cell matrix in which the control gate electrodes 28 of the cells are connected to the address lines $X_i$, $X_{i+1}$, the second regions 23 are connected to the bit lines $B_i$, $B_{i+1}$ via the electrodes 30, and the first regions 22 are connected to a first power supply terminal 32 via the electrodes 29; a high-voltage power source $V_{pp}$ connected via a transfer gate $Q_{19}$ of an IGFET which works as drive means to operate the first regions 22 as drain regions and the second regions 23 as source regions during the writing operation, and to operate the first regions 22 as source regions and the second regions 23 as drain regions during the reading operation; a low-voltage power source $V_{SS}$ connected via a transfer gate $Q_{20}$ of an IGFET; a low-voltage power source $V_S$ commonly connected to the bit lines $B_i$, $B_{i+1}$ via a transfer gate $Q_{17}$ of an IGFET; and control signals C, E and F applied to the transfer gates. Here, symbols $Q_{15}$, $Q_{16}$ and $Q_{18}$ denote transfer gates of IGFET's, and SA denotes a sense amplifier.

In the writing operation, a high positive voltage of, for example, 6 volts is applied from the power source $V_{pp}$ via the electrodes 29 to the first impurity regions 22 where an intense electric field is established in the depletion layers so as to operate as drains. In the reading operation, on the other hand, a positive voltage of, for example, 2.5 volts is applied from the sense amplifier SA via bit lines and electrodes 30 to the second regions 23 where less intense electric field is established in the depeltion layers. This helps prevent the phenomenon of unintentional writing from occurring in the repetitive reading operation.

That is, according to the present invention, the second regions 23 where less intense electric field is established in the depletion layers are used as drain regions in the reading operation. Therefore, the electric field intensity is reduced in the drains during the reading operation, and the phenomenon of unintentional writing is prevented from occurring. Namely, the depletion layer by the applied voltage can be effectively extended into the low impurity portion 23b as well as to the substrate. Therefore, the field intensity in the depletion layer (drain electric field) is extremely reduced.

In FIG. 5, the electrodes 30 work as drain electrodes during the reading operation and as source electrodes during the writing operation. The electrodes 29 work as source electrodes during the reading operation and as drain electrodes during the writing operation. In this memory cell array, therefore, the direction of channel current differs depending upon the writing operation and the reading operation. The second impurity region 23 is so formed that the drain field is weakened by the offset gate construction, and the first impurity region 22 is so formed that the drain field is intensified by, for example, the shallow junction construction. Thus, the memory cell array of the present invention utilizes the asymmetry in the current injection efficiency that stems from the direction of channel current; i.e., electrons are injected at a low voltage in the direction of channel current, and the injection of electrons is restrained in the opposite direction of channel current.

With this circuit, the writing is effected under the below-mentioned operation mode when a memory cell $Q_{11}$ is selected. That is, a high-voltage signal is applied as a control signal E and a low-voltage signal is applied as a control signal F to render the transfer gate $Q_{19}$ of an IGFET conductive state and the transfer gate $Q_{20}$ of an IGFET nonconductive state, so that a high potential source $V_{pp}$ is applied to the electrodes 29 of all memory cells. A high voltage is applied to the address line $X_i$ only to select the memory cell $Q_{11}$. Since the memory cells $Q_{13}$, $Q_{14}$ connected to the address line $X_{i+1}$ has a low gate voltage, the electrons are not injected irrespective of whether the sources thereof assume a low potential or an open potential. The voltage is applied to the bit line select signal line $Y_i$ to select the memory cell $Q_{11}$; a low potential is applied to other bit line select signal lines. That is, the transfer gate $Q_{15}$ of an IGFET is rendered conductive state and the transfer gate $Q_{16}$ is non-conductive state. Except the memory cell $Q_{11}$ connected to the bit line $X_i$, therefore, all other memory cells assume an open potential on the source electrodes thereof, whereby no channel current flows and no channel injection takes place. Since a high-voltage signal is applied as a control signal C, the source of the memory cell $Q_{11}$ is connected to the low-voltage power source $V_S$ through two stages of transfer gates $Q_{15}$ and $Q_{17}$ of IGFET's. This voltage may be either ground potential or a fixed low voltage generated in the device. In this case, it is desired that the sense amplifier SA is disconnected from the bit lines by applying a low-voltage signal as a control signal D to the transfer gate $Q_{18}$ of an IFGET to render it nonconductive state. Under this condition, the channel current flows from the power source $V_{pp}$ through the memory cell $Q_{11}$, and the memory cell $Q_{11}$ is programmed, that is, the hot electrons are injected in the floating gate electrode of memory cell $Q_{11}$ by the channel injection. This memory can be erased using ultraviolet rays.

Operation of the circuit during the reading operation will be described below with reference to the case where the memory cell $Q_{14}$ is selected. During the reading operation, low-voltage signals are applied as control signals C, E to render the gates $Q_{17}$, $Q_{19}$ of IGFET's nonconductive state, and the bit lines $B_i$, $B_{i+1}$ and the electrodes 29 of all memory cells $Q_{11}$ to $Q_{14}$ are disconnected from the power sources $V_S$ and $V_{pp}$. Then, high-voltage signals are applied as control signals D, F to render the transfer gates $Q_{18}$, $Q_{20}$ of IGFET's conductive state, so that the bit lines are connected to the sense amplifier SA and the electrodes 29 are connected to the power source $V_{SS}$. From the standpoint of sensing speed, the power source $V_{SS}$ should desirably assume ground potential in a customary manner. When the memory cell $Q_{14}$ is selected, the voltage is applied to only the bit line select signal line $Y_{i+1}$ and the bit line $X_{i+1}$, and the electric charge is supplied from the sense amplifier to the bit lines. The potential of the bit line swings between the high potential and the low potential depending upon the turn on and turn off of the memory cell $Q_{14}$. By detecting this potential, therefore, the data stored in the memory cell $Q_{14}$ can be read out. That is, a voltage of 5 volts is applied to the control electrode 28 of the cell $Q_{14}$ and to the second impurity region 23 is applied a voltage of 2.5 volts from the sense amplifier through the transfer gate $Q_{18}$ and the bit line $B_{i+1}$.

When the memory cell $Q_{14}$ is rendered conductive, the electric charge of the bit line is discharged through the memory cell $Q_{14}$. Therefore, the discharge rate varies depending upon the conductance of the cell $Q_{14}$. The larger the voltages of the address lines and of the power source for reading the sense amplifier, the greater the conductance of the memory cell $Q_{14}$. In this embodiment, the phenomenon of unintentional writing is suppressed during the reading operation. Therefore, the above voltages can be set to large values, to obtain a large conductance. According to this embodiment, as described above, the writing operation can be effected at a low voltage, and in the reading operation the phenomenon of unintentional writing can be suppressed.

Figure 6:
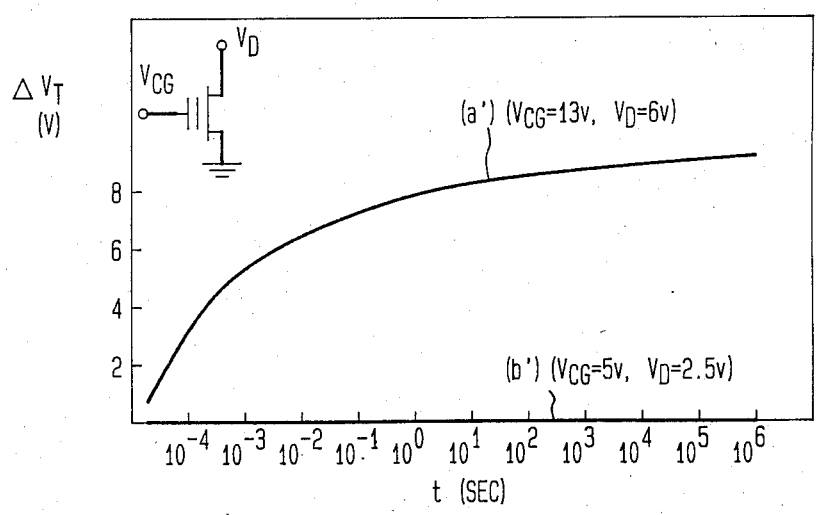
FIG. 6 is a characteristic diagram showing the change of threshold voltage of the memory cell of FIG. 4 with the lapse of time during the writing operation (a')and the reading operation (b').

FIG. 6 is a diagram showing the changing quantity $\Delta T_T$ (the deviation of threshold voltage from the erased state by ultraviolet rays) with the lapse of time of the threshold voltage $V_T$ of a memory cell during the writing operation and the reading operation when the memory cell array of FIG. 5 is constituted by the memory cells of FIG. 4. In FIG. 6, a curve (a') represents characteristics during the writing operation, and a curve (b') represents characteristics during the reading operation. The bias conditions are the same as those of the conventional example of FIG. 3. Though the threshold voltage changes quite in the same manner as that of FIG. 3 during the reading operation, it should be noted that there is no change in the threshold voltage during the reading operation of the present invention. Therefore, there arises no problem of unintentional writing and high reliability is maintained even when the reading operation is carried out repetitively for extended periods of time or even when a surge voltage is applied thereto.

Though the foregoing description has dealt with the case where the memory matrix is constituted by four memory cells, it should be noted that the invention is further applicable to general memory matrixes consisting of M rows and N columns, as a matter of course. Further, the memory cell should in no way be limited to the one shown in FIG. 4 but may be any other one having the construction as described above. Further, the invention is in no way limited to the embodiment of the construction in which the electric field intensity of the depletion layer of the second region is weakened. Moreover, the present invention can be adapted to the EPROM cells of the P-channel type, as a matter of course.

According to the present invention as described in detail in the foregoing, there is obtained a highly reliable EPROM device which prevents the phenomenon a unintentional writing from developing, which permits the programming to be carried out on a low voltage, and which does not deteriorate the programming efficiency.

What is claimed is:

1. An erasable, programmable read-only memory device comprising a plurality of erasable, programmable read-only memory cells of channel injection type formed in a semiconductor substrate of one conductivity type in a matrix shape, a plurality of bit lines extending on one major surface of said substrate, and a plurality of address lines extending on said one major surface of said substrate, each of said cells including a first impurity region of the opposite conductivity type formed in said substrate, a second impurity region of the opposite conductivity type formed in said substrate and electrically connected to the corresponding bit line, a channel region positioned between said first and second impurity regions, a floating gate electrode formed on said channel region via a first gate insulating film, and a control gate electrode formed on the floating gate electrode via a second gate insulating film and electrically connected to the corresponding address line, said second impurity region being so constituted that the intensity of electric field near said channel region in a depletion layer formed between said second impurity region and said substrate is weaker than that in a depletion layer formed between said first impurity region and said substrate when an inversed voltage of a predetermined level against said substrate is applied to said first and second impurity region, respectively, said device further comprising a first means for applying voltages to said first and second impurity regions and said control gate electrode of a selected cell such that electric channel current flows in one direction between said first and second regions of said selected cell in writing operation, and a second means for applying voltage to said first and second impurity regions and said control gate electrode of a selected cell such that electric channel current may flow in the opposite direction between said first and second impurity regions in reading operation.

2. A read-only memory device of claim 1, in which said first impurity region is used as drain and said second impurity region as source in said writing operation, and said first impurity region is used as source and said second impurity region as drain in reading operation.

3. A read-only memory device of claim 1, in which said first impurity region has a high impurity concentration, and said second impurity region includes a first portion having the same impurity concentration as that of said first impurity region and a second portion having a lower impurity concentration than that of said first portion and positioned between said first portion and said channel region.

* * * * *